United States Patent
Yamamoto et al.

(10) Patent No.: US 12,077,727 B2
(45) Date of Patent: Sep. 3, 2024

(54) SEMICONDUCTOR AQUEOUS COMPOSITION AND USE OF THE SAME

(71) Applicant: Merck Patent GmbH, Darmstadt (DE)

(72) Inventors: Kazuma Yamamoto, Kakegawa (JP); Maki Ishii, Kakegawa (JP); Tatsuro Nagahara, Kakegawa (JP)

(73) Assignee: Merck Patent GmbH, Darmstadt (DE)

( * ) Notice: Subject to any disclaimer, the term of this patent is extended or adjusted under 35 U.S.C. 154(b) by 580 days.

(21) Appl. No.: 17/288,196

(22) PCT Filed: Oct. 21, 2019

(86) PCT No.: PCT/EP2019/078495
§ 371 (c)(1),
(2) Date: Apr. 23, 2021

(87) PCT Pub. No.: WO2020/083809
PCT Pub. Date: Apr. 30, 2020

(65) Prior Publication Data
US 2021/0403829 A1   Dec. 30, 2021

(30) Foreign Application Priority Data

Oct. 24, 2018  (JP) .................... 2018-199941

(51) Int. Cl.
| | | |
|---|---|---|
| *C11D 1/88* | (2006.01) | |
| *G03F 7/40* | (2006.01) | |
| *H01L 21/311* | (2006.01) | |
| *H01L 21/768* | (2006.01) | |

(52) U.S. Cl.
CPC ............... *C11D 1/88* (2013.01); *G03F 7/40* (2013.01); *H01L 21/31144* (2013.01); *H01L 21/768* (2013.01); *C11D 2111/22* (2024.01)

(58) Field of Classification Search
CPC .................................................. H01L 21/31144
See application file for complete search history.

(56) References Cited

U.S. PATENT DOCUMENTS

| | | | | |
|---|---|---|---|---|
| 5,502,251 A | 3/1996 | Pohmer et al. | | |
| 7,741,260 B2* | 6/2010 | Koshiyama | ............ | C11D 3/245 429/336 |
| 7,846,637 B2* | 12/2010 | Ishizuka | ............... | C08F 232/08 526/242 |
| 7,879,529 B2* | 2/2011 | Endo | ............ | G03F 7/11 549/9 |
| 8,003,587 B2* | 8/2011 | Lee | .......... | C11D 3/30 510/176 |
| 8,158,328 B2* | 4/2012 | Sawano | ............... | G03F 7/0046 430/273.1 |
| 2003/0036569 A1* | 2/2003 | Lamanna | ................. | C09G 1/02 516/98 |
| 2005/0159322 A1* | 7/2005 | Min | ........................ | C11D 3/164 510/175 |
| 2008/0026975 A1 | 1/2008 | Koshiyama et al. | | |
| 2008/0063984 A1 | 3/2008 | Zhang et al. | | |
| 2008/0193876 A1* | 8/2008 | Sawada | ............... | H01L 21/0273 430/326 |
| 2009/0203566 A1 | 8/2009 | Lee et al. | | |
| 2013/0164694 A1* | 6/2013 | Wang | ...................... | G03F 7/405 430/325 |
| 2014/0057437 A1* | 2/2014 | Kozawa | ................ | H01L 21/308 438/689 |
| 2016/0020395 A1 | 1/2016 | Funyuu et al. | | |
| 2016/0109805 A1 | 4/2016 | Matsuura et al. | | |
| 2020/0259085 A1 | 8/2020 | Funyuu et al. | | |

FOREIGN PATENT DOCUMENTS

| | | |
|---|---|---|
| CN | 100355491 C | 12/2007 |
| EP | 1580607 A2 | 9/2005 |
| EP | 1621596 A2 | 2/2006 |
| EP | 1752827 A1 | 2/2007 |
| JP | 02-019847 A | 1/1990 |
| JP | 02-141636 A | 5/1990 |
| JP | 02-209977 A | 8/1990 |
| JP | 03-206458 A | 9/1991 |
| JP | 04-219757 A | 8/1992 |
| JP | 05-281745 A | 10/1993 |
| JP | 09-073173 A | 3/1997 |
| JP | 09-090637 A | 4/1997 |
| JP | 10-161313 A | 6/1998 |
| JP | 5336306 B2 | 11/2013 |

(Continued)

OTHER PUBLICATIONS

International Preliminary Report on Patentability received for PCT Patent Application No. PCT/EP2019/078495, dated May 6, 2021, 8 pages.
International Search Report and Written Opinion received for PCT Patent Application No. PCT/EP2019/078495, dated Feb. 7, 2020, 11 pages.

*Primary Examiner* — William A Harriston
(74) *Attorney, Agent, or Firm* — Faegre Drinker Biddle & Reath LLP

(57) ABSTRACT

[Problem] To provide a semiconductor aqueous composition capable of preventing a pattern collapse and suppressing a bridge defect. [Means for Solution] A semiconductor aqueous composition comprising a single or plurality of surfactant(s) having a monovalent anion part represented by formula (I): Chain 1-$X^1$—$X^2$-Chain 2 (I) wherein, $X^1$ and $X^2$ are each independently —C(=0)- or —S(=0)$_2$-, and Chain 1 and Chain 2 are each independently a linear or branched $C_{1-20}$ alkyl, wherein one or more H in said $C_{1-20}$ alkyl are replaced by F, and one or more methylenes in Chain 1 may be replaced by -0-, with the proviso that Chain 1 and Chain 2 may be bonded to form a ring structure) and a monovalent cation part other than hydrogen ion; and water.

26 Claims, No Drawings

(56) References Cited

FOREIGN PATENT DOCUMENTS

| | | |
|---|---|---|
| KR | 10-2016-0005776 A | 1/2016 |
| TW | 200600983 A | 1/2006 |
| TW | 200613492 A | 2/2006 |
| TW | 200611970 A | 4/2006 |
| TW | 201639941 A | 11/2016 |
| TW | 201809247 A | 3/2018 |
| WO | 2017/220479 A1 | 12/2017 |
| WO | 2018/095885 A1 | 5/2018 |

* cited by examiner

SEMICONDUCTOR AQUEOUS COMPOSITION AND USE OF THE SAME

CROSS-REFERENCE TO RELATED APPLICATIONS

This application is a national stage application (under 35 U.S.C. § 371) of PCT/EP2019/078495, filed Oct. 21, 2019, which claims benefit of Japanese Application No. 2018-199941, filed Oct. 24, 2018, both of which are incorporated herein by reference in their entirety.

BACKGROUND OF THE INVENTION

Technical Field

The present invention relates to a semiconductor aqueous composition comprising: a surfactant having a monovalent specific anion part and a monovalent cation part, and water. The present invention also relates to a method for manufacturing a resist pattern or a semiconductor using the semiconductor aqueous composition.

Background Art

In recent years, needs for high integration of LSI has been increasing, and refining of patterns is required. In order to respond to such needs, lithography processes using KrF excimer laser (248 nm), ArF excimer laser (193 nm), extreme ultraviolet (EUV; 13 nm) and X-ray of short wavelength, electron beam, etc. have been put to practical use. In order to respond to such refining of resist patterns, also for photosensitive resin compositions to be used as a resist during refining processing, those having high resolution are required. However, as refining progresses as described above, resist pattern collapse tends to occur.

The resist pattern collapse is considered to occur also when a negative pressure is generated between the patterns due to the surface tension of pure water when the patterns are washed with pure water after development. From such a point of view, in order to improve resist pattern collapse, it has been proposed replacing the conventional pure water with a rinse solution containing a specific component.

In a real product, a semiconductor has a complicated circuit, unlike a circuit in which lines simply run parallel at equal intervals. In the production of such a complicated circuit, bridge defects tend to easily occur at the place where the distance between the walls of the resist pattern is the narrowest. It is also important to prevent such bridge defects in order to reduce the occurrence frequency of defective products.

For example, in Patent Document 1, it is attempted to reduce defects using a perfluoro surfactant for lithography applications.

PRIOR ART DOCUMENTS

Patent Documents

[Patent document 1] WO2018/095885

SUMMARY OF THE INVENTION

Problems to be Solved by the Invention

The inventors thought that there existed still one or more problems that improvement was required. They include, for example, followings: reducing defects in the fine resist pattern (for example, suppressing occurrence of bridging); preventing resist pattern from being collapsed in the fine resist pattern; reducing the amount of surfactant contained in a semiconductor aqueous composition; preventing the shape of the resist pattern from being collapsed by a semiconductor aqueous composition (for example, by being dissolved); suppressing the shape variation of the resist pattern; reducing the residue after removing a semiconductor aqueous composition; lowering the surface tension of a semiconductor aqueous composition; and providing a semiconductor aqueous composition good in storage stability (for example, long-term storage).

The present invention has been made based on the technical background as described above and provides a semiconductor aqueous composition.

Means for Solving the Problems

The semiconductor aqueous composition according to the invention comprises:
a single or plurality of surfactant(s) having a monovalent anion part represented by formula (I) and a monovalent cation part other than hydrogen ion; and water.

$$\text{Chain 1-}X^1\text{—}N^-\text{—}X^2\text{-Chain 2} \quad (I)$$

wherein,
$X^1$ is —C(=O)— or —S(=O)$_2$—,
$X^2$ is —C(=O)— or —S(=O)$_2$—,
Chain 1 is a linear or branched $C_{1\text{-}20}$ alkyl, wherein one or more H in the $C_{1\text{-}20}$ alkyl are replaced by F, and one or more methylenes in Chain 1 may be replaced by —O—, and Chain 2 is a linear or branched $C_{1\text{-}20}$ alkyl, wherein one or more H in the $C_{1\text{-}20}$ alkyl are replaced by F, and one or more methylenes in Chain 2 may be replaced by —O—, with the proviso that Chain 1 and Chain 2 may be bonded to form a ring structure.

Further, the method for manufacturing a resist pattern according to the present invention uses the semiconductor aqueous composition according to the present invention.

Further, the method for manufacturing a semiconductor according to the present invention comprises the method for manufacturing a resist pattern according to the present invention.

Effects of the Invention

It is possible to reduce defects in fine resist patterns. It is possible to prevent resist pattern from being collapsed in fine resist patterns. It is possible to reduce the amount of surfactant contained in the semiconductor water soluble composition. It is possible to prevent the shape of the resist pattern from being collapsed by the semiconductor aqueous composition. It is possible to suppress the shape variation of the resist pattern. It is possible to reduce the residue after removing the semiconductor aqueous composition. It is possible to lower the surface tension of the semiconductor aqueous composition. It is possible to make the storage stability of the semiconductor aqueous composition good.

MODE FOR CARRYING OUT THE INVENTION

The above outline and the details to be described below are for the purpose of explaining the present invention and not for the purpose of limiting the claimed invention.

In the present specification, unless otherwise specifically mentioned, the singular includes the plural and "one" or "that" means "at least one". In the present specification, unless otherwise specifically mentioned, an element of a concept can be expressed by a plurality of species, and when the amount (for example, mass % or mol %) is described, it means sum of the plurality of species.

"and/or" includes a combination of all elements and also includes single use of the element.

In the present specification, when a numerical range is indicated using "to" or "-", unless otherwise specifically mentioned, it includes both endpoints and units thereof are common. For example, 5 to 25 mol % means 5 mol % or more and 25 mol % or less.

In the present specification, the descriptions such as "$C_{x\text{-}y}$", "$C_x\text{-}C_y$" and "$C_x$" mean the number of carbons in a molecule or substituent. For example, $C_{1\text{-}6}$ alkyl means an alkyl chain having 1 or more and 6 or less carbons (methyl, ethyl, propyl, butyl, pentyl, hexyl etc.).

In the present specification, when a polymer has plural types of repeating units, these repeating units copolymerize. Unless otherwise specifically mentioned, these copolymerizations may be any of alternating copolymerization, random copolymerization, block copolymerization, graft copolymerization, or any mixture of any of these.

In the present specification, unless otherwise specifically mentioned, Celsius is used as the temperature unit. For example, 20 degrees means 20 degrees Celsius.

<Semiconductor Aqueous Composition>

The semiconductor aqueous composition according to the present invention (hereinafter also referred to as composition) comprises (1) a certain surfactant and (2) water.

Here, the semiconductor aqueous composition in the present invention means an aqueous composition to be used in a semiconductor manufacturing process, and more preferably to be used in a lithography process. Further, in the present invention, the "surfactant" refers to a compound itself having a surfactant activity. Although there may be a case in which a compound having surfactant activity is dissolved or dispersed in a solvent and contained in a composition, such a solvent is contained in the present semiconductor aqueous composition as "water or other solvent". Details are described below.

The semiconductor aqueous composition according to the present invention is used in a semiconductor manufacturing process. Preferably, it is used in a cleaning process in the semiconductor manufacturing process. That is, the semiconductor aqueous composition according to the present invention is preferably a semiconductor aqueous cleaning composition. Particularly, one embodiment of the present invention is to be used for cleaning a resist pattern produced by exposing/developing (lithography technique) a resist film. That is, the semiconductor aqueous composition according to the present invention is more preferably a resist pattern cleaning composition. The semiconductor aqueous composition of the present invention may be removed in the semiconductor manufacturing process and may not remain in the final semiconductor.

Here, the resist pattern includes not only one obtained by exposing/developing a resist film but also one having a wall thickened by further covering it with other layer(s) or film(s) (one in which its space width is further made finer).

As a technique for thickening the wall by further covering it with other layer(s) or film(s), a publicly known one can be used. For example, in JP-B No. 5,069,494, a resist pattern is further made finer by a resin composition.

(1) Surfactant

The surfactant to be used in the present invention is a compound composed of a combination of monovalent anion part represented by the formula (I) and a monovalent cation part other than hydrogen ion,

Chain 1-$X^1$—$N^-$—$X^2$-Chain 2 (I)

wherein, $X^1$ is —C(=O)— or —S(=O)$_2$—, $X^2$ is —C(=O)— or —S(=O)$_2$—,

Chain 1 is a linear or branched $C_{1\text{-}20}$ alkyl, wherein one or more H in the $C_{1\text{-}20}$ alkyl are replaced by F, and one or more methylenes in Chain 1 may be replaced by —O—, and Chain 2 is a linear or branched $C_{1\text{-}20}$ alkyl, wherein one or more H in the $C_{1\text{-}20}$ alkyl are replaced by F, and one or more methylenes in Chain 2 may be replaced by —O—, with the proviso that Chain 1 and Chain 2 may be bonded to form a ring structure.

Here, in the present invention, the alkyl terminal methyl of Chain 1 or Chain 2 is not substituted by —O—. That is, Chain1 or Chain2 has no hydroxy at the end.

At least one of $X^1$ and $X^2$ is preferably —S(=O)$_2$—, and more preferably both are —S(=O)$_2$—. It is also a preferred embodiment that $X^1$ is —C(=O)— and $X^2$ is —S(=O)$_2$—. As one embodiment, the carbon number of alkyl in Chain 1 is preferably more than or equal to, and more preferably more than the carbon number of alkyl in Chain 2.

Chain 1 is preferably a linear or branched $C_{1\text{-}15}$ alkyl, more preferably a $C_{1\text{-}10}$ alkyl, and further preferably a $C_{2\text{-}10}$ alkyl. Preferably, all H in $C_{1\text{-}20}$ alkyl in Chain 1 is replaced by F. Among the methylenes in Chain 1, the number of methylenes replaced by —O— is preferably 0 to 5, more preferably 0 to 3, and further preferably 0 to 2. It is also a preferred embodiment that one or more methylenes in Chain 1 are not replaced by —O— (the number of methylenes to be replaced is 0).

Chain 2 is preferably a linear or branched $C_{1\text{-}8}$ alkyl, more preferably $C_{1\text{-}6}$ alkyl, and further preferably $C_{1\text{-}4}$ alkyl. Preferably, Chain 2 is a linear $C_{1\text{-}8}$ alkyl. Preferably, all H in $C_{1\text{-}20}$ alkyl in Chain 2 is replaced by F. Among the methylenes in Chain 2, the number of methylenes replaced by —O— is preferably 0 to 5, more preferably 0 to 3, and further preferably 0 to 2. It is also a preferred embodiment that one or more methylenes present in Chain 2 are not replaced by —O— (the number of methylenes to be replaced is 0).

Among those defined in the formula (I), Chain 1 is preferably represented by the formula (Ia)-1:

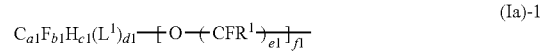

$C_{a1}F_{b1}H_{c1}(L^1)_{d1}$—(—O—(CFR$^1$)$_{e1}$)$_{f1}$— (Ia)-1 wherein, $L^1$ is a single bond, which bonds to Chain 2, a1 is 0, 1, 2, 3, 4, or 5, b1 is an integer of 1 or more, c1 is an integer of 0 or more, d1 is 0 or 1, and b1+c1+d1=2(a1)+1, $R^1$ is each independently —F, —CF$_3$, —CF$_2$H, —CFH$_2$, or —CH$_3$, and when e1≥2, each $R^1$ can be the same to or different from each other, e1 is 0, 1, 2, or 3, and f1 is 0, 1, 2, or 3.

Among those defined in the formula (I), Chain 2 is preferably represented by the formula (Ia)-2:

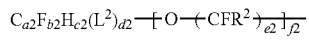
(Ia)-2 wherein,
$L^2$ is a single bond, which bonds to Chain 1,
a2 is an integer of 0 to 5, b2 is an integer of 1 or more, c2 is an integer of 0 or more, d2 is 0 or 1, and b2+c2+d2=2(a2)+1,
$R^2$ is each independently —F, —$CF_3$, —$CF_2H$, —$CFH_2$, or —$CH_3$, and when e2≥2, each $R^2$ can be same to or different from each other,
e2 is 0, 1, 2, or 3, and
f2 is 0, 1, 2, or 3.

In addition, when Chain 1 is represented by the formula (Ia)-1 and d1 is 1, Chain 2 is represented by the formula (Ia)-2 and d2 is also 1. And vice versa. At this time, $L^1$ in Chain 1 and $L^2$ in Chain 2 constitute one single bond, and Chain 1 and Chain 2 are combined to form a ring structure containing —$X^1$—N—$X^2$—. When d1=d2=1, it is preferred that $L^1$ be located at the end of Chain 1 and $L^2$ be located at the end of Chain 2.

For example, the following monovalent anion part can be represented by the formula (I), Chain 1 can be represented by the formula (Ia)-1, and Chain 2 can be represented by the formula (Ia)-2. In the formulae, a1=2, b1=4, c1=0, d1=1, f1=0, and a2=1, b2=2, c2=0, d2=1, f2=0. $L^1$ in Chain 1 and $L^2$ in Chain 2 constitute one single bond, and Chain 1 and Chain 2 are bonded to form a ring structure.

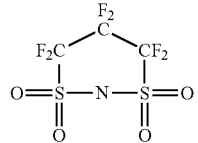

When d1=d2=0, Chain 1 and Chain 2 are not combined to form a ring structure.

The embodiments in the formula (Ia)-1 are described below. a1 is preferably 1, 2, 3, 4 or 5, more preferably 2, 3 or 4, and further preferably 3 or 4. {b1/(b1+c1)} is preferably 0.5 to 1.0, more preferably 0.80 to 1.0, and further preferably 1.0. It is preferable that d1 is zero. In addition, in order to reduce the bulkiness of the monovalent anion part, it is also an embodiment that d1=1.

e1 is preferably 0, 1 or 2, more preferably 1 or 2. When e1≥2, $R^1$ may be same to or different from each other. f1 is preferably 0, 1 or 2, more preferably 1 or 2. f1=0 is also a preferred embodiment. When f1≥2, —O—$(CFR^1)_{e1}$— may be same to or different from each other. Preferably, each $R^1$ is independently —F or —$CF_3$.

For example, the structure to the left of —C(=O)— of the following monovalent anion part can be represented by Chain 1 and can further be represented by formula (Ia)-1. At that time, a1=3, b1=7, c1=0, d1=0, and f1=2. In —O—$(CFR^1)_{e1}$— enclosed with [ ], e1 is 2 and —$(CFR^1)_{e1}$— is, from the left, —CF(—$CF_3$)— and —$CF_2$—, respectively. That is, $R^1$ corresponds, from the left, to —$CF_3$ and —F, respectively. Further, in —O—$(CFR^1)_{e1}$-enclosed with ( ), e1 is 1 and —$(CFR^1)_{e1}$— is —CF(—$CF_3$)—. That is, $R^1$ corresponds to —$CF_3$.

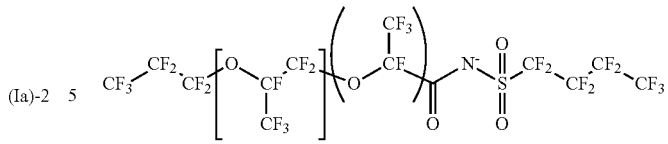

The embodiments in the formula (Ia)-2 are described below. a2 is preferably 1, 2, 3, 4 or 5, more preferably 1, 3 or 4 and further preferably 3 or 4. {b2/(b2+c2)} is preferably 0.5 to 1.0, more preferably 0.80 to 1.0, and further preferably 1.0. It is preferable that d2 is zero. In addition, in order to reduce the bulkiness of the monovalent anion part, it is also an embodiment that d2=1.

e2 is preferably 0, 1 or 2, more preferably 1 or 2. When e2≥2, $R^2$ may be same to or different from each other. f2 is preferably 0, 1 or 2, more preferably 1 or 2. f2=0 is a further preferred embodiment. When f22, —O—$(CFR^2)_{e1}$— may be same to or different from each other. Preferably, each $R^2$ is independently —F or —$CF_3$.

Exemplified embodiments of the monovalent anion part represented by the formula (I) are listed below, but the present invention is not limited thereto.

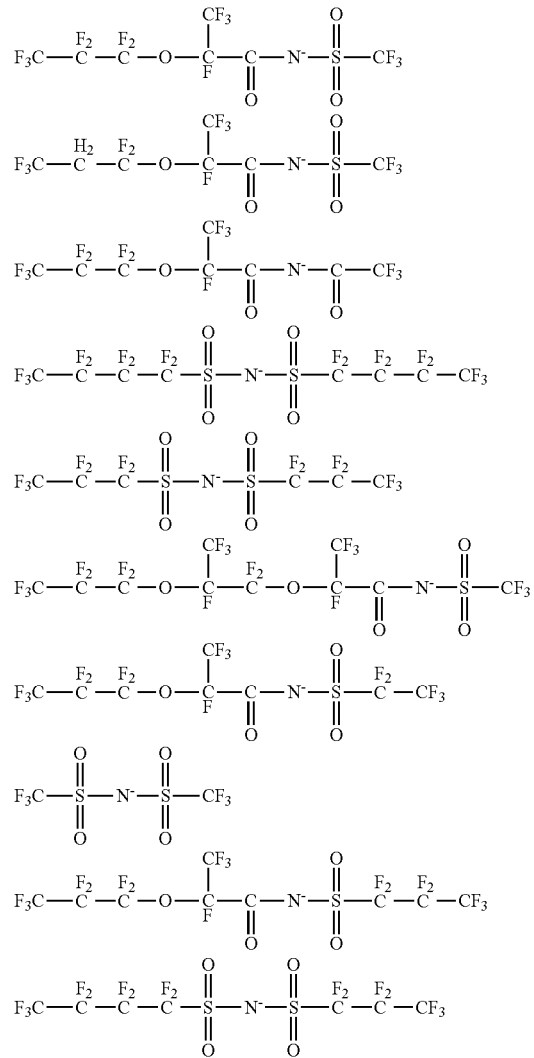

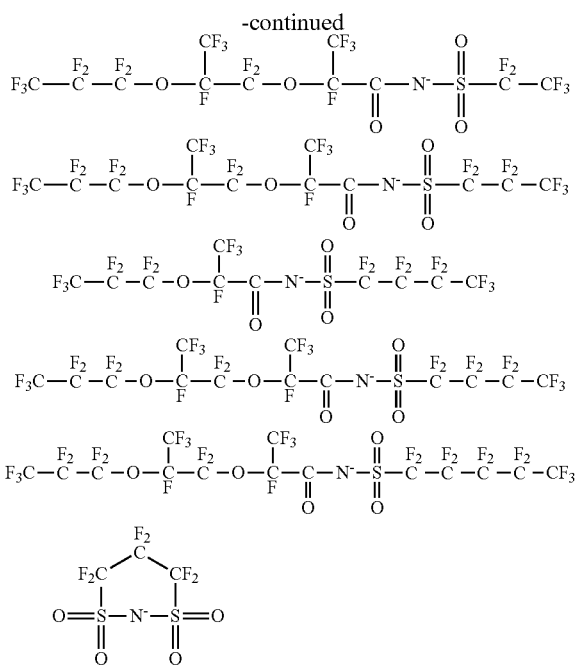

The monovalent cation part used in the present invention is not particularly limited, but preferably comprises at least any one of a metallic cation, an inorganic ammonium cation, and an organic ammonium cation. For example, a plurality of cations may be included.

More preferably, the monovalent cation part used in the present invention is a metal cation, an inorganic ammonium cation or an organic ammonium cation, and further preferably an inorganic ammonium ion and an organic ammonium ion.

Further preferably, the monovalent cation part is represented by the formula (Ib):

$$^+NH_pR^b_{4-p} \quad \text{(Ib)}$$

wherein,
  $R^b$ is each independently a linear $C_{1-3}$ alkyl, wherein one or more H in the linear $C_{1-3}$ alkyl may be replaced by hydroxy, and
  p is 0, 1, 2, 3, or 4.

Preferably, p is 0 or 1. In addition, p=4 is also a preferred embodiment. Preferably, $R^b$ is each independently a linear $C_{1-2}$ alkyl. When p≤2, Rb may be same to or different from each other, and is preferably same.

When one or more hydrogens in the linear $C_{1-3}$ alkyl are substituted by hydroxy, it is preferable that the hydrogen of terminal methyl is substituted by hydroxy. In one embodiment of the present invention, it is preferred that one or two of the terminal methyl are substituted by hydroxy.

In another embodiment of the present invention, it is preferable that one or less hydrogen atoms in the linear $C_{1-3}$ alkyl is hydroxy-substituted, more preferably unsubstituted.

Exemplified embodiments of the monovalent cation part include cations derived from ammonium such as ammonium ($NH_4^+$), tetramethyl ammonium, tetraethyl ammonium, tetrapropyl ammonium, trimethyl ammonium, triethyl ammonium, tripropyl ammonium, (2-hydroxyethyl) trimethyl ammonium, dimethyl ammonium, diethyl ammonium, methyl ammonium, and ethyl ammonium. Preferably, the monovalent cation part is ammonium or triethyl ammonium.

In addition, phosphonium ($PH_4^+$), tropylium ($C_7H_7^+$) and the like can also be used.

Although the combination of the above-mentioned anion part and cation part is not specifically limited, a surfactant which has the above-mentioned preferable anion part and preferable cation part is more preferable. It is preferable to prepare the composition according to the present invention by dissolving in water a compound composed of the monovalent anion part and the monovalent cation part.

The content of the surfactant is preferably 0.005 to 2.0 mass %, more preferably 0.005 to 1.0 mass %, further preferably 0.005 to 0.5 mass %, and still more preferably 0.01 to 0.4 mass %, based on the total mass of the semiconductor aqueous composition. These contents do not include water or other solvents.

For example, when a compound having surfactant activity is dissolved or dispersed in water or other solvent and added to the composition, the amount of water or other solvent is not included in the above-mentioned content of the surfactant. These amounts are included in the content of water or other solvent.

(2) Water

Water is a substance which occupies the largest mass ratio to the whole composition according to the present invention. The amount of water contained is preferably 90 to 99.995 mass %, more preferably 95 to 99.995 mass %, and further preferably 98 to 99.99 mass %, based on the whole composition. The water preferably includes pure water, DW, and deionized water.

It is also possible that the composition according to the invention comprises solvent(s) other than water. Solvents other than water are described later.

The composition according to the present invention comprises the above-mentioned (1) surfactant and (2) water as essential components but may contain further compounds as required. Details are described later. In addition, the content of the components other than (1) and (2) occupies in the whole composition (in the case of a plurality thereof, the sum thereof) is preferably 3.0 mass % or less, more preferably 1.0 mass % or less, and further preferably 0.1 mass % or less, based on the total mass.

(3) Alcohol Compound

Preferably, the composition according to the present invention preferably further comprises a $C_{3-30}$ alcohol compound which has 1 to 3 hydroxy groups and may be substituted by F. Using the composition containing this alcohol compound, the limit size not to collapse (detailed later) can be further reduced. The fluorine substitution replaces H in said alcohol compound with F, but this substitution does not replace H in hydroxy (OH).

This alcohol compound is preferably a compound represented by the formula (III):

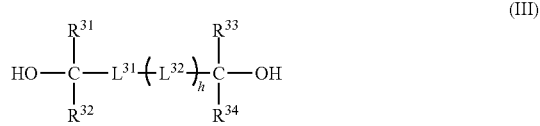

wherein,
  $R^{31}$, $R^{32}$, $R^{33}$, and $R^{34}$ are each independently H, F, or a $C_{1-5}$ alkyl, preferably H, F, methyl, ethyl, t-butyl, or isobutyl, more preferably H, methyl or ethyl.
  $L^{31}$ and $L^{32}$ are each independently a $C_{1-20}$ alkylene, a $C_{1-20}$ cycloalkylene, a $C_{2-4}$ alkenylene, a $C_{2-4}$ alkynylene, or $C_{6-20}$ arylene. These groups may be substituted by F, a $C_{1-5}$ alkyl, or hydroxy. Here, alkenylene means a divalent hydrocarbon having one or more double bonds, and alkynylene means a divalent hydrocarbon group having one or more triple bonds. Preferably, $L^{31}$ and $L^{32}$ are each independently a $C_{1-5}$ alkylene, a $C_{2-4}$ alkynylene, or phenylene ($C_6$ arylene), wherein these groups may be substituted by F. $L^{31}$ and $L^{32}$ are each independently, more preferably a $C_{2-4}$ alkylene, acetylene ($C_2$ alkynylene), or phenylene, wherein these groups may be substituted by F, and further preferably a $C_{2-4}$ alkylene, or acetylene, wherein these groups may be substituted by F.

h is 0, 1, or 2, preferably 0 or 1, and more preferably 0.

The compound represented by the formula (III) is more preferably a diol compound.

Exemplified embodiments of the alcohol compound include 3-hexyne-2,5-diol, 2,5-dimethyl-3-hexyne-2,5-diol, 3,6-dimethyl-4-octin-3,6-diol, 1,4-butynediol, 2,4-hexadiyne-1,6-diol, 1,4-butanediol, 2,2,3,3-tetrafluoro-1,4-butanediol, 2,2,3,3,4,4,5,5-octafluoro-1,6-hexanediol, cis-1,4-dihydroxy-2-butene, 1,4-benzenedimethanol, and any combination of any of these.

The content of the above-mentioned alcohol compound is preferably 0.005 to 2.0 mass %, more preferably 0.005 to 1.0 mass %, further preferably 0.005 to 0.5 mass %, and still more preferably 0.01 to 0.2 mass %, based on the total mass of the semiconductor aqueous composition according to the present invention.

(4) Other Additives

The semiconductor aqueous composition according to the present invention may further comprise an antibacterial agent, a germicide, an antiseptic, an antifungal agent, a surfactant other than said surfactant, an acid, a base, an organic solvent, or any mixture of any of these.

An antibacterial agent, a germicide, an antiseptic, an antifungal agent or any mixture of any of these (hereinafter referred to as antibacterial agent etc.) are used to prevent bacteria or fungi from propagating in the aqueous composition which has been aged. Examples of antibacterial agent etc. include alcohols such as phenoxyethanol and isothiazolone. As commercially available antibacterial agent etc., BESTCIDE (trade name) of Nippon Soda Co., Ltd. can be referred. As a preferable embodiment of the semiconductor aqueous composition according to the present invention, a composition comprising one kind of antibacterial agent can be referred.

The content of the antibacterial agent etc. (in the case of a plurality thereof, the sum thereof) is preferably 0.0001 to 1 mass %, and more preferably 0.0001 to 0.01 mass %, based on the whole composition according to the present invention.

A surfactant other than the above-mentioned surfactant (1) (hereinafter referred to as other surfactant) is useful for improving coating properties and solubility. As other surfactant, polyoxyethylene alkyl ether compounds such as polyoxyethylene lauryl ether, polyoxyethylene stearyl ether and polyoxyethylene oleyl ether; polyoxyethylene alkylaryl ether compounds such as polyoxyethylene octylphenol ether and polyoxyethylene nonylphenol ether; polyoxyethylene/polyoxypropylene block copolymer compounds; sorbitan fatty acid ester compounds such as sorbitan rnonolaurate, sorbitan rnonopalrnitate, sorbitan monostearate, sorbitan trioleate and sorbitan tristearate; polyoxyethylene sorbitan fatty acid ester compounds such as polyoxyethylene sorbitan rnonolaurate, polyoxyethylene sorbitan rnonopalrnitate, polyoxyethylene sorbitan monostearate and polyoxyethylene sorbitan tristearate can be referred. In addition, fluorine-based surfactants such as EFTOP EF301, EF303 and EF352 (trade name, manufactured by Tochem Products Co., Ltd.), MEGAFAC F171, F173, R-08, R-30 and R-2011 (trade name, manufactured by DIC Corporation), FLUORAD FC430 and FC431 (trade name, manufactured by 3M Japan Limited), ASAHI GUARD AG710 and SURFLON S-382, SC101, SC102, SC103, SC104, SC105 and SC106 (trade name, manufactured by AGC Inc.), and organosiloxane polymer KP 341 (manufactured by Shin-Etsu Chemical Co., Ltd.), and the like can be referred.

The content of the other surfactant is preferably 0.01 to 5 mass %, more preferably 0.05 to 3 mass %, further preferably 0.005 to 0.5 mass %, and still more preferably 0.01 to 0.4 mass %, based on the total mass of the composition according to the present invention In the present invention, the surfactant represented by the formula (I) is a salt composed of a monovalent anion part (acid) and a monovalent cation part (base), but other acid(s) or base(s) may be used to adjust the pH of the processing solution or to improve the solubility of the added components. Although the acid or base to be used can be freely selected in the range which does not impair the effect of the present invention, for example, carboxylic acids, amines, an ammonium compounds can be referred. These include fatty acids, aromatic carboxylic acids, primary amines, secondary amines, tertiary amines, ammonium compounds, which may be substituted by any substituent or unsubstituted. More particularly, formic acid, acetic acid, propionic acid, benzoic acid, phthalic acid, salicylic acid, lactic acid, malic acid, citric acid, oxalic acid, malonic acid, succinic acid, fumaric acid, maleic acid, aconitic acid, glutaric acid, adipic acid, monoethanolamine, diethanolamine, triethanolamine, triisopropanolarnine, ethylenediamine, diethylenetriarnine, pentaethylenehexarnine, piperidine, piperazine, morpholine, tetrannethylannnnoniunn hydroxide and the like can be referred.

The content of the acid is preferably 0.005 to 0.1 mass % based on the total mass of the composition according to the invention. In addition, the content of the base is preferably 0.01 to 0.3 mass % based on the total mass of the composition according to the invention.

An organic solvent is useful for dissolving the solutes contained in the composition according to the invention. As the organic solvent, known ones can be used.

For example, cyclohexanone, cyclopentanone, propylene glycol monomethyl ether (PGME), propylene glycol monoethyl ether, propylene glycol monopropyl ether, propylene glycol rnonobutyl ether, propylene glycol dimethyl ether, propylene glycol diethyl ether, propylene glycol 1-monomethyl ether 2-acetate (PGMEA), propylene glycol monoethyl ether acetate, propylene glycol monopropyl ether acetate, γ-butyrolactone, ethyl lactate, or any mixture of any of these are preferred. These are preferable in terms of storage stability of the solution.

The content of the organic solvent (in the case of a plurality thereof, the sum thereof) is preferably 0 to 9.995 mass %, preferably 0 to 5 mass %, and further preferably 0 to 1 mass % based on the total mass of the semiconductor aqueous composition according to the present invention. It is also preferable embodiment of the present invention that no organic solvent is contained (0.0 mass %).

Although the method for synthesizing the surfactant of (1) used in the present invention is not particularly limited, working examples are described in the following synthesis examples. It is also possible to combine known synthesis methods with the synthesis examples.

<Method for Manufacturing Resist Pattern>

The method for manufacturing a resist pattern according to the present invention uses the semiconductor aqueous composition according to the present invention. The lithography process in the method may be any of the method for manufacturing a resist pattern using a positive or negative type photosensitive resin composition (resist composition). A representative method for manufacturing a resist pattern to which the semiconductor aqueous composition of the present invention is applied comprises:
(1) applying a photosensitive resin composition on a substrate, with or without one or more interlayers, to form a photosensitive resin layer;
(2) exposing the photosensitive resin layer to radiation;
(3) developing the exposed photosensitive resin layer; and
(4) cleaning the developed layer with the semiconductor aqueous composition according to the present invention.

Details will be described below.

First, a photosensitive resin composition is applied on a substrate such as a silicon substrate, a glass substrate, or the like, which has been optionally pretreated, to form a photosensitive resin layer. Any publicly known method can be used for the application, but a coating method such as spin coating is suitable. The photosensitive resin composition may be directly applied on a substrate or may be applied via one or more intermediate layers (for example, a BARC). Further, an anti-reflective film (for example, a TARC) may be applied on the photosensitive resin layer (opposite side of the substrate). Layers other than the photosensitive resin layer are described later. By forming an anti-reflective film on or under the photosensitive resin film, the cross-sectional shape and the exposure margin can be improved.

Typical examples of publicly known positive or negative type photosensitive resin composition used in the resist pattern manufacturing method of the present invention include one comprising a quinone diazide type photosensitizer and an alkali-soluble resin, a chemically amplified photosensitive resin composition, and the like. From the viewpoint of forming a fine resist pattern with high resolution, a chemically amplified photosensitive resin composition is preferable and, for example, a chemically amplified PHS-acrylate hybrid type EUV resist composition can be referred.

Examples of the quinone diazide type photosensitizer used in the above-described positive type photosensitive resin composition comprising the quinone diazide type photosensitizer and the alkali-soluble resin include 1,2-benzoquinone diazide-4-sulfonic acid, 1,2-naphthoquinone diazide-4-sulfonic acid, 1,2-naphthoquinone diazide-5-sulfonic acid, and esters or amides of these sulfonic acids; and examples of the alkali-soluble resin also used in the composition include novolac resin, polyvinyl phenol, polyvinyl alcohol, copolymer of acrylic acid or methacrylic acid, and the like. Preferable examples of the novolac resin include one produced from one or more phenols such as phenol, o-cresol, m-cresol, p-cresol and xylenol, and one or more aldehydes such as formaldehyde and paraformaldehyde.

Further, the chemically amplified photosensitive resin composition includes a positive type chemically amplified photosensitive resin composition comprising a compound that generates an acid upon radiation irradiation (photoacid generator), and a resin whose polarity is increased by the action of the acid generated from the photoacid generator and whose solubility to a developing solution varies in an exposed part and an unexposed part; or a negative type chemically amplified photosensitive resin composition comprising an alkali-soluble resin, a photoacid generator and a crosslinking agent, in which crosslinking of the resin due to the crosslinking agent is caused by the action of the acid and the solubility to a developing solution varies in an exposed part and an unexposed part.

As the resin whose polarity is increased by said action of the acid and whose solubility to a developing solution varies between an exposed part and an unexposed part, a resin having a group which is decomposed due to the action of the acid to form an alkali-soluble group in the main chain or side chain of the resin or both main and side chains thereof can be referred. Typical examples thereof include polymer in which an acetal group or a ketal group is introduced as a protective group to a hydroxystyrene-based polymer (PHS) (for example, JP-A No. H2-141,636, JP-A No. H2-19,847, JP-A No. H4-219,757 and JP-A No. H5-281,745); similar polymer into which a t-butoxycarbonyloxy group or a p-tetrahydropyranyloxy group is introduced as an acid decomposable group (JP-A No. H2-209,977, JP-A No. H3-206,458 and JP-A No. H2-19,847); resin copolymerized a monomer having a moiety of carboxylic acid such as acrylic acid or methacrylic acid, or a monomer having a hydroxyl group or a cyano group in a molecule, with a monomer having an alicyclic hydrocarbon group; acid sensitive resin comprising an alkali-insoluble group protected with a structure containing an alicyclic group and a structural unit that become alkali-soluble when the alkali-insoluble group is eliminated by an acid (JP-A No. H9-73,173, JP-A No. H9-90,637 and JP-A No. H10-161,313); and the like.

Further, the photoacid generator may be any compound as long as it generates an acid upon irradiating radiation, and examples thereof include onium salts such as diazonium salts, ammonium salts, phosphonium salts, iodonium salts, sulfonium salts, selenonium salts and arsonium salts, organic halogen compounds, organometallic compounds/organic halides, photoacid generators having an o-nitrobenzyl type protective group, compounds capable of photolysis to generate a sulfonic acid represented by inninosulfonate and the like, disulfone compounds, diazoketosulfones, diazodisulfone compounds, and the like. Further, compounds in which these groups or compounds capable of generating an acid by light are introduced into the main chain or the side chain of polymer can also be used.

Additionally, said chemically amplified photosensitive resin composition may further comprise, if needed, an acid decomposable and dissolution inhibiting compound, a dye, a plasticizer, a surfactant, a photosensitizer, an organic basic compound, and a compound that promotes solubility to developing solution, and the like.

For example, said photosensitive resin composition is applied onto a substrate by a suitable coating apparatus such as a spinner and a coater by means of a suitable coating method and soft-baked on a hot plate to remove the solvent in the photosensitive resin composition, thereby forming a photosensitive resin layer. The soft-baking temperature varies depending on the solvent or the resist composition to be used, but is generally 70 to 150° C., and preferably 90 to 150° C., and soft-baking can be carried out for 10 to 180 seconds, preferably for 30 to 90 seconds in the case of hot plate, or for 1 to 30 minutes in the case of clean oven.

In the method for manufacturing the resist pattern of the present invention, the presence of film(s) or layer(s) other than the photosensitive resin layer is also allowed. Without direct contact of the substrate with the photosensitive resin layer, intermediate layer(s) may be interposed. The intermediate layer is a layer to be formed between a substrate and a photosensitive resin layer and is referred also to as underlayer film. As the underlayer film, a substrate modifying film, a planarizing film, a bottom anti-reflecting coating (BARC), an inorganic hard mask intermediate layer (silicon oxide film, silicon nitride film and silicon oxide nitride film) can be referred. As to the formation of the inorganic hard mask intermediate layer, reference can be made to JP-B No. 5,336,306. The intermediate layer may be composed of one layer or a plurality of layers. In addition, a top anti-reflective coating (TARC) may be formed on the photosensitive resin layer.

For the layer constitution in the process for manufacturing the resist pattern of the present invention, any publicly known technique can be used in accordance with process conditions. For example, the following layer constitution can be referred.

substrate/underlayer film/photoresist film
substrate/planarizing film/BARC/photoresist film
substrate/planarizing film/BARC/photoresist film/TARC
substrate/planarizing film/inorganic hard mask intermediate layer/photoresist film/TARC
substrate/planarizing film/inorganic hard mask intermediate layer/BARC/photoresist film/TARC
substrate/planarizing film/adhesive film/BARC/photoresist film/TARC
substrate/substrate modifying layer/planarizing film/BARC/photoresist film/TARC
substrate/substrate modifying layer/planarizing film/adhesive film/BARC/photoresist film/TARC These layers can be obtained by coating and thereafter heating and/or exposing to cure, or by employing a publicly known method such as CVD method to form a film. These layers can be removed by a publicly known method (etching or the like) and can be patterned using the upper layer as a mask.

The photosensitive resin layer is exposed through a predetermined mask. When other layers (TARC etc.) are also included, they may be exposed together. The wavelength of the radiation (light) used for exposure is not particularly limited, but it is preferable to perform exposure with light having a wavelength of 13.5 to 248 nm. Particularly, KrF excimer laser (wavelength: 248 nm), ArF excimer laser (wavelength: 193 nm), extreme ultraviolet ray (wavelength: 13.5 nm) and the like can be used, and extreme ultraviolet ray is more preferable. These wavelengths allow a range of ±5%, and preferably a range of ±1%. After the exposure, post exposure bake (PEB) may be performed, if needed. The temperature for post-exposure heating is appropriately selected from 70 to 150° C., preferably 80 to 120° C., and the heating time is appropriately selected from 0.3 to 5 minutes, preferably 0.5 to 2 minutes.

Thereafter, development is performed with a developing solution. For the development in the method for manufacturing the resist pattern of the present invention, a 2.38 mass % (±1% is allowed) TMAH aqueous solution is preferably used. Further, a surfactant or the like may be added to these developers. Generally, the temperature of the developing solution is appropriately selected from 5 to 50° C., preferably 25 to 40° C., and the developing time is appropriately selected from 10 to 300 seconds, preferably from 20 to 60 seconds. As the developing method, any publicly known methods such as paddle development can be used.

As described above, the resist pattern of the present invention includes not only one obtained by exposing/developing a resist film but also one having a wall thickened by further covering it with other layer(s) or film(s).

The resist pattern (the developed photosensitive resin layer) formed up to the above steps is in a non-cleaned state. This resist pattern can be cleaned with the semiconductor aqueous composition of the present invention. The time for bringing the semiconductor aqueous composition into contact with the resist pattern, that is, the processing time is preferably 1 second or more. In addition, the processing temperature may be also freely determined. The method for bringing a rinse liquid into contact with the resist is also freely selected, and it can be done, for example, by immersing a resist substrate in a rinse liquid or dropping a rinse liquid onto a rotating resist substrate surface.

In the method for manufacturing the resist pattern of the present invention, the resist pattern after being developed can be cleaned with other cleaning liquid before and/or after the cleaning processing with the present semiconductor aqueous composition. The other cleaning liquid is preferably water, and more preferably pure water (DW, deionized water etc.). The cleaning before the present processing is useful for cleaning the developing solution that has adhered to the resist pattern. The cleaning after the present processing is useful for cleaning the semiconductor aqueous composition. One preferred embodiment of the manufacturing method of the present invention is a method comprising cleaning the pattern after being developed while substituting the developing solution by pouring pure water onto a resist pattern, and further cleaning the pattern while substituting pure water by pouring the semiconductor aqueous composition while keeping the pattern immersed in pure water.

The cleaning with the semiconductor aqueous composition may be carried out by any conventionally known method. It can be done, for example, by immersing a resist substrate in the semiconductor aqueous composition, or by dropping the semiconductor aqueous composition onto a rotating resist substrate surface. These methods may be carried out in appropriate combination thereof.

It has been found that with respect to the resist pattern manufactured by the method of the present invention, occurrence of defects such as bridges was suppressed, and it was thus cleaned better. In the present specification, the bridge is one in which unintended structure(s) exist in the groove(s) of a resist pattern and is a kind of defect. The reason includes that the resist patterns (walls) are connected to each other or that foreign substance which should be flowed is caught in the groove and remains therein. When an intended groove is filled with bridge(s), it becomes impossible to design an intended circuit in a succeeding process such as etching. The mechanism by which the occurrence of defects such as bridges is suppressed when the composition according to the present invention is used has not been elucidated, and it was unexpected that such an effect could be obtained.

When the space width becomes narrower, a bridge is easily generated in a trench (groove) between the resist patterns, which is a problem for manufacturing a highly integrated semiconductor.

As one of the conditions under which defects such as bridges are likely to occur, there is a place where the distance between a wall and a wall of the resist pattern is the narrowest. At a place where a wall and a wall of the resist pattern are aligned in parallel, this becomes a severe condition. In the present specification, the distance of the interval at the place where the interval is the smallest on one circuit unit is regarded as a minimum space size. It is preferable that one circuit unit becomes one semiconductor in a later process. Further, it is also a preferable embodiment that one semiconductor includes one circuit unit in the horizontal direction and a plurality of circuit units in the vertical direction. Of course, unlike the test sample, if the occurrence frequency of the place where the interval between a wall and a wall is narrow is low, the occurrence frequency of defects decreases, so that the occurrence frequency of defective products decreases.

In the present invention, the minimum space size of the resist pattern in one circuit unit is preferably 10 to 30 nm, more preferably 15 to 25 nm, and further preferably 18 to 22 nm.

<Method for Manufacturing Semiconductor>

Using the resist pattern manufactured by the manufacturing method of the present invention as a mask, the intermediate layer and/or the substrate can be patterned. For pattern formation, publicly known methods such as etching (dry etching and wet etching) can be used. For example, an intermediate layer is etched using a resist pattern as an etching mask, and a substrate can be etched using the obtained intermediate layer pattern as an etching mask to form a pattern on the substrate. Further, while etching layer(s) lower than the photoresist layer (for example, intermediate layer), it is also possible, using a photoresist pattern as an etching mask, to etch a substrate as it is. Wiring can be formed on the substrate utilizing the formed pattern.

These layers can be removed, suitably by dry etching with $O_2$, $CF_4$, $CHF_3$, $Cl_2$ or $BCl_3$, and suitably, $O_2$ or $CF_4$ can be used.

Thereafter, the substrate is further processed, if needed, and a device is formed. For the further processing, publicly known methods can be applied. After formation of the device, the substrate is optionally cut into chips, connected to a lead frame, and packaged with resin. In the present invention, this packaged product is called a semiconductor.

The present invention is described by use of examples as follows. In addition, the embodiment of the present invention is not limited only to these examples.

<Synthesis Example of the Surfactant Used in Comparative Example Composition>

200 g of a 48 mass % potassium hydroxide aqueous solution and 150 g of perfluoroethane sulfonamide are mixed in a flask. The solution is distilled to remove water and give a concentrated solid. 50 g of this concentrated solid and 65 g of the following compound a are dissolved in 200 g of acetonitrile and stirred at 50° C. for 20 hours. The resulting solution is filtered and distilled to remove acetonitrile to give a solid. The obtained solid is dissolved in 200 g of water, and to the solution is added 100 g of 36 mass % aqueous hydrochloric acid solution and Novec (trademark) 7300 (manufactured by 3M Company). The liquid phase of Novec is collected and distilled to obtain surfactant S-201. The yield is 20%.

Synthesis Example 1 of Surfactant 20 g of triethylamine is added to surfactant S-201 and stirred at 30° C. for 14 hours. The solution is distilled to obtain surfactant S-101. The yield is 15%.

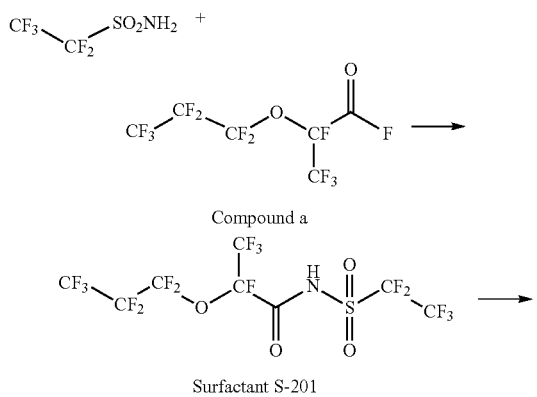

Compound a

Surfactant S-201

Surfactant S-101

Synthesis Example 2 of Surfactant

Surfactant S-102 is synthesized in the same manner as in Synthesis Example 1 except that ammonia is used instead of triethylamine.

Synthesis Example 3 of Surfactant

In a flask, 5 g of surfactant S-102 is dissolved in 45 g of tetrahydrofuran (hereinafter THF). To this, a solution of 10 g of tetraethylammonium chloride dissolved in 90 g of THF is added dropwise at 25° C. for 2 hours. After the addition is completed, the solution is stirred at 25° C. for 16 hours. The solution is then filtered and distilled to obtain surfactant S-103. The yield is 65%.

Surfactant S-102

Surfactant S-103

Preparation Example of Semiconductor Aqueous Composition

Surfactant S-101 is added to deionized water so as to make the concentration of 1000 ppm, and this is stirred and completely dissolved to prepare Example Composition 101.

Example Compositions 102 to 112 are prepared in the same manner as described above using surfactants having the anion part and the cation part as described in Table 1 so as to make the concentrations described in Table 1. Furthermore, Comparative Example Compositions 201 to 211 are prepared using the surfactants described in Table 1 in the same manner as described above. Here, the surfactants described in Table 1 are obtained by changing the cation part from hydrogen (C1) to C2 to 7, respectively.

TABLE 1

|  | | Concentration ppm | Anion part | Cation part |
|---|---|---|---|---|
| Example Composition 101 | SurfactantS-101 | 1000 | A5 | C3 |
| Example Composition 102 | SurfactantS-104 | 1000 | A1 | C2 |
| Example Composition 103 | SurfactantS-105 | 500 | A1 | C2 |
| Example Composition 104 | SurfactantS-106 | 1000 | A2 | C2 |
| Example Composition 105 | SurfactantS-107 | 1000 | A3 | C3 |
| Example Composition 106 | SurfactantS-106 | 1000 | A4 | C2 |
| Example Composition 107 | SurfactantS-107 | 1000 | A6 | C4 |
| Example Composition 108 | SurfactantS-108 | 1000 | A7 | C5 |
| Example Composition 109 | SurfactantS-109 | 1000 | A8 | C6 |
| Example Composition 110 | SurfactantS-110 | 1000 | A9 | C7 |
| Example Composition 111 | SurfactantS-111 | 1000 | A10 | C3 |
| Example Composition 112 | SurfactantS-112 | 1000 | A11 | C2 |
| Comparative Example Composition 201 | SurfactantS-201 | 1000 | A5 | C1 |
| Comparative Example Composition 202 | SurfactantS-202 | 1000 | A1 | C1 |
| Comparative Example Composition 203 | SurfactantS-203 | 1000 | A2 | C1 |
| Comparative Example Composition 204 | SurfactantS-204 | 1000 | A3 | C1 |
| Comparative Example Composition 205 | SurfactantS-205 | 1000 | A4 | C1 |
| Comparative Example Composition 206 | SurfactantS-206 | 1000 | A6 | C1 |
| Comparative Example Composition 207 | SurfactantS-207 | 1000 | A7 | C1 |
| Comparative Example Composition 208 | SurfactantS-208 | 1000 | A8 | C1 |
| Comparative Example Composition 209 | SurfactantS-209 | 1000 | A9 | C1 |
| Comparative Example Composition 210 | SurfactantS-210 | 1000 | A10 | C1 |
| Comparative Example Composition 211 | SurfactantS-211 | 1000 | A11 | C1 |

In the table, A1 to A11 and C1 to C7 show the following structures. The same applies to Tables 2 and 3.

A1
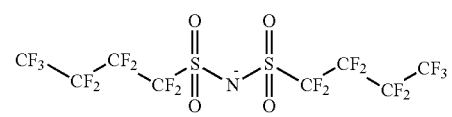

A2
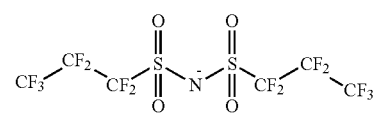

A3
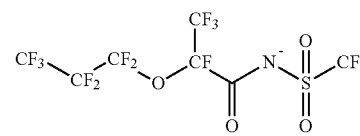

A4
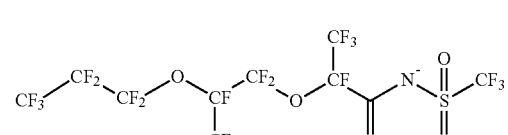

A5
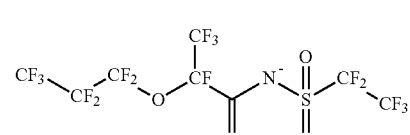

A6
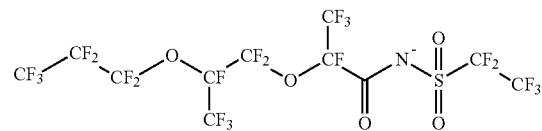

A7
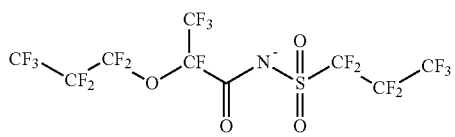

A8
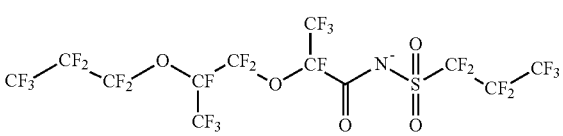

A9
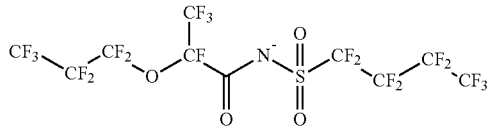

A10
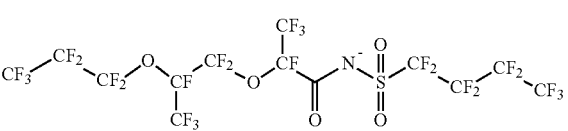

A11
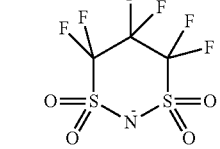

C1
H⁺

C2
NH4+

C3
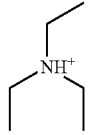

-continued

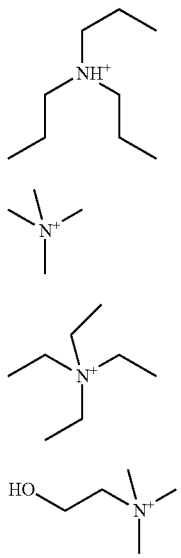

C4

C5

C6

C7

<Formation of Substrate for Evaluation>

The surface of a silicon substrate (manufactured by SUMCO Corporation, 12 inches) is processed with a 1,1,1,3,3,3-hexamethyldisilazane solution at 90° C. for 30 seconds. A chemically amplified PHS-acrylate hybrid type EUV resist composition is spin-coated thereon and soft-baked at 110° C. for 60 seconds, thereby forming a resist film having a thickness of 45 nm on the substrate. This is exposed through a mask having a size of 20 nm (line: space=1:1) with an EUV stepper NXE:3300 (manufactured by ASML Holding N. V.). Plural exposure amounts are set, and substrates of each condition are obtained. In addition, when the exposure amount increases, the space width of the resist pattern formed by later development is enlarged.

This substrate is subjected to PEB at 100° C. for 60 seconds. Thereafter, the resist film is subjected to puddle development for 30 seconds using a 2.38% tetramethylammonium hydroxide (TMAH) aqueous solution. In a state that a puddle developing solution is paddled on the substrate, deionized water is started to flow onto the substrate, the puddle developing solution is replaced, while being rotated, with deionized water, and the development is stopped in a state of being puddled with deionized water. Then, each composition of Example Compositions 101 to 112 and Comparative Example Compositions 201 to 211 is poured onto this, and the substrate is spun at a high speed, thereby dried.

<Evaluation of Pattern Collapse Prevention Performance>

On the substrate for evaluation described above, a resist pattern having a line size of 19 nm formed for a mask of 20 nm is observed using an SEM apparatus CG5000 (manufactured by Hitachi High-Technologies Corporation) and the presence or absence of pattern collapse is observed.

No pattern collapse is confirmed when any composition of the Example Compositions and Comparative Example Compositions is used.

<Evaluation of Bridge Prevention Performance>

On the substrate for evaluation described above, a resist pattern having a space size of 15 nm formed for a mask of 20 nm is observed using CG5000 and the presence or absence of a pattern bridge is observed.

No pattern bridges are confirmed respectively when Example Compositions are used. On the other hand, pattern bridges are confirmed respectively when Comparative Example Compositions are used.

<Limit Size not to Collapse>

The compositions used are described in Table 2 below. Preparation thereof is performed as described above.

The preparation of the substrate for evaluation is performed in the same manner as described above except that the exposure is performed through a mask having a size of 15 to 24 nm (line: space=1:1). The prepared composition is poured onto the substrate as described above, and the substrate is spun at high speed for spin drying.

The formed resist pattern is observed using CG 5000, and the pattern size for each mask size (15 to 24 nm, line: space=1:1) to the exposure amount is measured. The case where the difference between the mask size and the pattern size is within ±1 nm and where the pattern is formed without being collapsed is judged as "not being collapsed". The mask size that is immediately before the pattern collapses is regarded as "limit size not to collapse". For example, in the case where pattern collapse is confirmed at 17.4 nm for a mask of 17 nm and 1:1, the size 18 nm immediately before not to collapse is regarded as "limit size not to be collapsed". The results are described in Table 2.

<Space Size Generating No Bridge and Evaluation of LWR>

The compositions used are described in Table 2 below.

The preparation of the substrate for evaluation is performed in the same manner as described above except that the exposure is performed through a mask having a size of 18 nm (line: space=1:1). The prepared composition is poured onto the substrate as described above, and the substrate is spun at high speed for spin drying.

The formed resist pattern is observed using CG5000 and the presence or absence of a bridge is observed, and the pattern size with respect to the exposure amount is measured. The exposure amount is varied, and a space size, in which space no bridge occurs, is regarded as "space size in which no bridge occurs". For example, in the case of Example Composition 113, a pattern bridge is confirmed with a space size of 13.6 nm. On the other hand, since no bridge is confirmed at 14.7 nm, the minimum space size is determined 14.7 nm.

<Evaluation of LWR>

Example Compositions used are described in Table 2 below.

The preparation of the substrate for evaluation is performed in the same manner as described above except that the exposure is performed through a mask having a size of 15 to 24 nm (line: space=1:1). Each of Example Compositions is poured onto the substrate as described above, and the substrate is spun at high speed for spin drying.

With respect to a pattern formed within 20 nm±1 nm for a mask of 20 nm (line: space=1:1), LWR is measured by CG5500. The program recommended by ITRS is used.

The obtained results are shown in Table 2.

TABLE 2

|  |  | Concentration ppm | Anion part | Cation part | Limit size not to collapse (nm) | Space size generating no bridge (nm) | LW R |
|---|---|---|---|---|---|---|---|
| Example Composition 102 | SurfactantS-104 | 1000 | A1 | C2 | 19 | 14.4 | 3.9 |
| Example Composition 113 | SurfactantS-113 | 1500 | A1 | C2 | 17 | 14.7 | 3.8 |
| Example Composition 114 | SurfactantS-114 | 1500 | A8 | C3 | 17 | 14.4 | 3.8 |
| Example Composition 115 | SurfactantS-115 | 1500 | A9 | C2 | 17 | 14.6 | 3.8 |
| Comparative Example Composition 202 | SurfactantS-202 | 1000 | A1 | C1 | 19 | 16.2 |  |
| Comparative Example Composition 212 | SurfactantS-212 | 1500 | A1 | C1 | 17 | 16.8 |  |
| Comparative Example Composition 213 | SurfactantS-203 | 1500 | A8 | C1 | 17 | 16.2 |  |

<Composition Including Further Alcohol Compound>

The surfactant and the alcohol compound described in Table 3 below are added to deionized water so as to make the concentrations described in Table 3 respectively, and this is stirred to dissolve completely to prepare Example Compositions 201 to 204.

With respect to these, the limit size not to collapse is measured in the same manner as described above. The results obtained are as shown in Table 3. Compared to the limit size not to collapse in the cases of Table 2, the limit size not to collapse is further reduced in the cases of the compositions further including the alcohol compound.

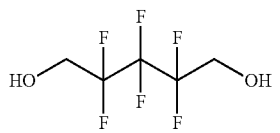

D3

TABLE 3

|  |  | Surfactant | | | Alcohol compound | | Limit size not to collapse (nm) |
|---|---|---|---|---|---|---|---|
|  | Variety | Concentration ppm | Anion part | Cation part | Concentration ppm | Variety |  |
| Example Composition 201 | SurfactantS-104 | 1000 | A1 | C2 | 250 | D1 | 18 |
| Example Composition 202 | SurfactantS-113 | 1500 | A1 | C2 | 500 | D2 | 16 |
| Example Composition 203 | SurfactantS-114 | 1500 | A8 | C3 | 1000 | D3 | 16 |
| Example Composition 204 | SurfactantS-115 | 1500 | A9 | C2 | 250 | D4 | 16 |

In the table, D1 to D4 show the following structures.

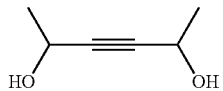

D1

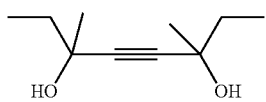

D2

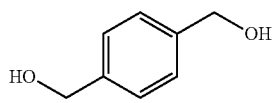

D4

The invention claimed is:
1. A semiconductor aqueous composition, comprising:
a single or plurality of surfactant(s) having a monovalent anion part represented by formula (I) and a monovalent cation part other than hydrogen ion; water, and a $C_{3-30}$ alcohol compound which has 1 to 3 hydroxy groups and may be substituted by F,
Chain 1 - $X^1$—N— —$X^2$- Chain 2 (I)

wherein, $X^1$ is —C(=O)— or —S(=O)$_2$—, $X^2$ is —C(=O)— or —S(=O)$_2$—,

Chain 1 is a linear or branched $C_{1-20}$ alkyl, wherein one or more H in the $C_{1-20}$ alkyl are replaced by F, and one or more methylenes in Chain 1 may be replaced by —O—, and Chain 2 is a linear or branched $C_{1-20}$ alkyl, wherein one or more H in the $C_{1-20}$ alkyl are replaced by F, and one or more methylenes in Chain 2 may be replaced by —O—, with the proviso that Chain 1 and Chain 2 may be bonded to form a ring structure.

2. The composition according to claim 1, wherein Chain 1 is represented by formula (Ia)-1 and Chain 2 is represented by formula (Ia)-2: wherein

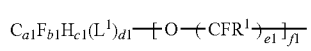
(Ia)-1

$L^1$ is a single bond, which bonds to Chain 2, a1 is 0, 1, 2, 3, 4, or 5, b1 is an integer of 1 or more, c1 is an integer of 0 or more, d1 is 0 or 1, and b1+c1+d1=2(a1)+1, $R^1$ is each independently —F, —CF$_3$, —CF$_2$H, —CFH$_2$, or —CH$_3$, and when e1≥2, each $R^1$ can be the same to or different from each other, e1 is 0, 1, 2, or 3, and f1 is 0, 1, 2, or 3]]

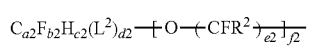
(Ia)-2

$L^2$ is a single bond, which bonds to Chain 1, a2 is 0, 1, 2, 3, 4, or 5, b2 is an integer of one or more, c2 is an integer of 0 or more, d2 is 0 or 1, and b2+c2+d2=2(a2)+1, $R^2$ is each independently —F, —CF$_3$, —CF$_2$H, —CFH$_2$, or —CH$_3$, and when e2≥2, each $R^2$ can be the same to or different from each other, e2 is 0, 1, 2, or 3, f2 is 0, 1, 2, or 3;

with the proviso that when d1 is 1, d2 is 1, and $L^1$ and $L^2$ come together as one single bond to form a ring structure, wherein Chain 1 and Chain 2 is bonded via the single bond.

3. The composition according to claim 1, wherein the monovalent cation part comprises at least any one of a metallic cation, an inorganic ammonium cation, or an organic ammonium cation.

4. The composition according to claim 1, wherein the monovalent cation part is represented by formula (Ib):

(Ib)

wherein,

Rb is each independently a linear $C_{1-3}$ alkyl, wherein one or more H in the $C_{1-3}$ alkyl may be replaced by hydroxy, and p is 0, 1, 2, 3, or 4.

5. The composition according to claim 1, wherein the alcohol compound is represented by the formula (III):

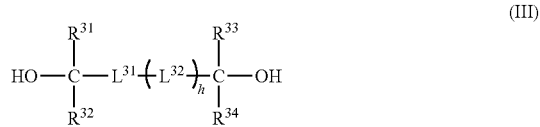
(III)

wherein, $R^{31}$, $R^{32}$, $R^{33}$ and $R^{34}$ are each independently H, F, or a $C_{1-5}$ alkyl, $L^{31}$ and $L^{32}$, are each independently a $C_{1-20}$ alkylene, a $C_{1-20}$ cycloalkylene, a $C_{2-4}$ alkenylene, a $C_{2-4}$ alkynylene, or a $C_{6-20}$ arylene, wherein these groups may be substituted by F, a $C_{1-5}$ alkyl, or hydroxy, and h is 0, 1, or 2.

6. The composition according to claim 1, wherein the content of the surfactant is 0.005 to 2.0 mass % based on the total mass of the composition.

7. The composition according to claim 1, wherein the content of the alcohol compound is 0.005 to 2.0 mass % based on the total mass of the composition.

8. The composition according to claim 1, further comprising an antibacterial agent, a germicide, an antiseptic, an antifungal agent, a surfactant other than said surfactant, an acid, a base, an organic solvent, or any mixture of any of these.

9. A semiconductor aqueous cleaning composition, consisting of the semiconductor aqueous composition according to claim 1.

10. A resist pattern cleaning composition, consisting of the semiconductor aqueous composition according to claim 1.

11. A method for manufacturing a resist pattern, using the semiconductor aqueous composition according to claim 1.

12. A method for manufacturing a resist pattern, comprising;
(1) applying a photosensitive resin composition on a substrate, with or without one or more interlayers, to form a photosensitive resin layer;
(2) exposing the photosensitive resin layer to radiation;
(3) developing the exposed photosensitive resin layer; and
(4) cleaning the developed layer with the semiconductor aqueous composition comprising:
a single or plurality of surfactant(s) having a monovalent anion part represented by formula (I) and a monovalent cation part other than hydrogen ion; and water, Chain 1 - $X^1$—N— —$X^2$- Chain 2  (I)

wherein, $X^1$ is —C(=O)— or —S(=O)$_2$—, $X^2$ is —C(=O)— or —S(=O)$_2$—,

Chain 1 is a linear or branched $C_{1-20}$ alkyl, wherein one or more H in the $C_{1-20}$ alkyl are replaced by F, and one or more methylenes in Chain 1 may be replaced by —O—, and Chain 2 is a linear or branched $C_{1-20}$ alkyl, wherein one or more H in the $C_{1-20}$ alkyl are replaced by F, and one or more methylenes in Chain 2 may be replaced by —O—, with the proviso that Chain 1 and Chain 2 may be bonded to form a ring structure.

13. The method for manufacturing a resist pattern according to claim 12, wherein the photosensitive resin composition is a chemically amplified photosensitive resin composition, and extreme ultraviolet radiation is used for the exposure.

14. The method for manufacturing a resist pattern according to claim 11, wherein the minimum space size of the resist pattern in a circuit unit is 10 to 30 nm.

15. A method for manufacturing a semiconductor, comprising the method for manufacturing a resist pattern according to claim 11.

16. A method for manufacturing a semiconductor, comprising performing etching using the resist pattern produced by the method according to claim 11 as a mask, and processing the substrate.

17. The method for manufacturing a semiconductor according to claim 16, comprising forming wiring on the processed substrate.

18. The method according to claim 12, wherein Chain 1 is represented by formula (Ia)-1 and Chain 2 is represented by formula (Ia)-2: wherein

(Ia)-1

$L^1$ is a single bond, which bonds to Chain 2,
a1 is 0, 1, 2, 3, 4, or 5, b1 is an integer of 1 or more, c1 is an integer of 0 or more, d1 is 0 or 1, and b1+c1+d1=2(a1)+1,
$R^1$ is each independently —F, —CF3, —CF2H, —CFH$_2$, or —CH$_3$, and when e1≥2, each R1 can be the same to or different from each other,
e1 is 0, 1, 2, or 3, and
f1 is 0, 1, 2, or 311]

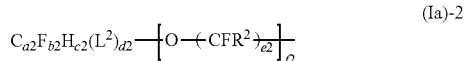
(Ia)-2

$L^2$ is a single bond, which bonds to Chain 1,
a2 is 0, 1, 2, 3, 4, or 5, b2 is an integer of one or more, c2 is an integer of 0 or more, d2 is 0 or 1, and b2+c2+d2=2(a2)+1,
$R^2$ is each independently —F, —CF$_3$, —CF$_2$H, —CFH$_2$, or —CH$_3$, and when e2≥2, each $R^2$ can be the same to or different from each other,
e2 is 0, 1, 2, or 3,
f2 is 0, 1, 2, or 3;
with the proviso that when d1 is 1, d2 is 1, and $L^1$ and $L^2$ come together as one single bond to form a ring structure, wherein Chain 1 and Chain 2 is bonded via the single bond.

19. The method according to claim 12, wherein the monovalent cation part comprises at least any one of a metallic cation, an inorganic ammonium cation, or an organic ammonium cation.

20. The method according to claim 12, wherein the monovalent cation part is represented by formula (Ib):

+NHpRb4-p (Ib)

wherein,
Rb is each independently a linear $C_{1-3}$ alkyl, wherein one or more H in the $C_{1-3}$ alkyl may be replaced by hydroxy, and
p is 0, 1, 2, 3, or 4.

21. The method according to claim 12, further comprising a $C_{3-30}$ alcohol compound which has 1 to 3 hydroxy groups and may be substituted by F.

22. The method according to claim 21, wherein the alcohol compound is represented by the formula (III):

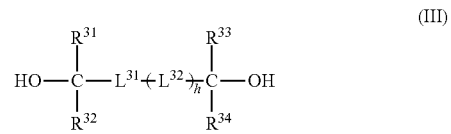
(III)

wherein,
$R^{31}$, $R^{32}$, $R^{33}$ and $R^{34}$ are each independently H, F, or a $C_{1-5}$ alkyl,
$L^{31}$ and $L^{32}$ are each independently a $C_{1-20}$ alkylene, a $C_{1-20}$ cycloalkylene, a $C_{2-4}$ alkenylene, a $C_{2-4}$ alkynylene, or a $C_{6-20}$ arylene, wherein these groups may be substituted by F, a $C_{1-5}$ alkyl, or hydroxy, and
h is 0, 1, or 2.

23. The method according to claim 12, wherein the content of the surfactant is 0.005 to 2.0 mass % based on the total mass of the composition.

24. The method according to claim 12, wherein the content of the alcohol compound is 0.005 to 2.0 mass % based on the total mass of the composition.

25. The method according to claim 12, further comprising an antibacterial agent, a germicide, an antiseptic, an antifungal agent, a surfactant other than said surfactant, an acid, a base, an organic solvent, or any mixture of any of these.

26. A semiconductor aqueous composition, comprising:
a single or plurality of surfactant(s) having a monovalent anion part represented by formula (I) and a monovalent cation part other than hydrogen ion; water, and an alcohol compound having a content of 0.005 to 2.0 mass % based on the total mass of the composition,
Chain 1 - $X^1$—N— —$X^2$- Chain 2    (I)
wherein,
$X^1$ is —C(=O)— or —S(=O)$_2$—,
$X^2$ is —C(=O)— or —S(=O)$_2$—, Chain 1 is a linear or branched $C_{1-20}$ alkyl, wherein one or more H in the $C_{1-20}$ alkyl are replaced by F, and one or more methylenes in Chain 1 may be replaced by —O—, and Chain 2 is a linear or branched $C_{1-20}$ alkyl, wherein one or more H in the $C_{1-20}$ alkyl are replaced by F, and one or more methylenes in Chain 2 may be replaced by —O—, with the proviso that Chain 1 and Chain 2 may be bonded to form a ring structure.

* * * * *